United States Patent
Lee et al.

(10) Patent No.: US 6,815,226 B2
(45) Date of Patent: Nov. 9, 2004

(54) FERROELECTRIC MEMORY DEVICE AND METHOD OF FORMING THE SAME

(75) Inventors: Kyu-Mann Lee, Kyunggi-do (KR); Yong-Tak Lee, Kyunggi-do (KR); Hyeong-Geun An, Kyunggi-do (KR)

(73) Assignee: Samsung Electronics, Co., Ltd., Kyunggi-do (KR)

( * ) Notice: Subject to any disclaimer, the term of this patent is extended or adjusted under 35 U.S.C. 154(b) by 0 days.

(21) Appl. No.: 10/613,102

(22) Filed: Jul. 7, 2003

(65) Prior Publication Data

US 2004/0005724 A1 Jan. 8, 2004

Related U.S. Application Data

(62) Division of application No. 10/134,436, filed on Apr. 30, 2002, now Pat. No. 6,664,578.

(30) Foreign Application Priority Data

Aug. 8, 2001 (KR) ........................................ 2001-47667

(51) Int. Cl.[7] ...................... H01L 21/00; H01L 21/8242
(52) U.S. Cl. ............................ 438/3; 438/240; 438/254
(58) Field of Search ............................ 438/3, 250–256, 438/239–242, 393–399

(56) References Cited

U.S. PATENT DOCUMENTS

| 5,573,979 A | | 11/1996 | Tsu et al. |
|---|---|---|---|
| 5,786,259 A | * | 7/1998 | Kang .......................... 438/396 |
| 6,020,233 A | | 2/2000 | Kim |
| 6,144,060 A | | 11/2000 | Park et al. |
| 6,201,271 B1 | | 3/2001 | Okutoh et al. |
| 6,333,534 B1 | * | 12/2001 | Chen .......................... 257/303 |
| 6,376,325 B1 | * | 4/2002 | Koo .......................... 438/396 |
| 6,396,097 B2 | | 5/2002 | Joo |
| 6,534,809 B2 | | 3/2003 | Moise et al. |
| 6,602,721 B2 | * | 8/2003 | Mikawa et al. ................ 438/3 |
| 2002/0024074 A1 | | 2/2002 | Jung et al. |
| 2002/0070404 A1 | | 6/2002 | Bruchhaus et al. |

FOREIGN PATENT DOCUMENTS

| KR | 1998-040642 | 8/1998 |
|---|---|---|
| KR | 2001-0003252 | 1/2001 |

* cited by examiner

Primary Examiner—John F. Niebling
Assistant Examiner—Jennifer M. Kennedy
(74) Attorney, Agent, or Firm—Harness, Dickey & Pierce, P.L.C.

(57) ABSTRACT

The method of forming a ferroelectric memory device includes forming capacitor patterns over a substrate, each capacitor pattern having an adhesive assistant pattern, a lower electrode, a ferroelectric pattern, and an upper electrode. An oxygen barrier layer is formed over the substrate and is etched to expose a sidewall of the ferroelectric pattern but not a sidewall of the adhesive assistant pattern. Then, a thermal process for curing ferroelectricity of the ferroelectric pattern is performed.

11 Claims, 4 Drawing Sheets

FERROELECTRIC MEMORY DEVICE AND METHOD OF FORMING THE SAME

RELATED APPLICATION

This application is a divisional of application Ser. No. 10/134,436, filed on Apr. 30, 2002, now U.S. Pat. No. 6,664,578, the entire contents of which are hereby incorporated by reference and for which priority is claims under 35 U.S.C. 120; and this application relies for priority upon Korean Patent Application No. 2001-47667, filed on Aug. 8, 2001, the contents of which are hereby incorporated by reference in their entirety.

FIELD OF THE INVENTION

The present invention relates to a ferroelectric memory device having a ferroelectric capacitor such as in a ferroelectric random access memory (FRAM) and a method of forming the same.

BACKGROUND OF THE INVENTION

When an external electric field is applied to a ferroelectric substance, a polarization is generated in the ferroelectric substance. Although the external electric field is removed, a significant amount of the polarization remains therein. Additionally, direction of self polarization therein can be controlled by changing the external electric field. A ferroelectric substance can be obtained by processing a high dielectric material such as PZT[Pb(Zi,Ti)$O_3$] and SBT [SrBi$Ta_2O_9$]. The physical characteristics of the ferroelectric substance are similar to the basic principle of a binary memory device. Thus, a memory device using a ferroelectric substance, such as a ferroelectric random access memory (FRAM), has been frequently investigated.

In order to form a ferroelectric substance, the high dielectric material such as the PZT or the SBT should have a ferroelectric crystalline structure called a "perovskite structure". In a conventional method of forming the perovskite structure, the ferroelectric substance is stacked in an amorphous state, heated up to a high temperature (for example, about 700° C.) in an oxidation ambient, and crystallized. However, even after the perovskite structure is formed, if physical impact occurs such as by anisotropical etching in a subsequent process, or if a certain material such as hydrogen penetrates into the ferroelectric layer by diffusion, this may cause serious damage to the characteristics of the ferroelectric substance.

More particularly, if a patterning, etching process for forming a capacitor is performed with respect to a ferroelectric layer having a ferroelectric structure, a ferroelectric layer at a peripheral part of the capacitor is damaged. This decreases capacitance of the capacitor, particularly where the capacitor size of a memory device using the ferroelectric layer is small according to the high integration of a semiconductor device.

In order to solve this problem, a method that eliminates patterning of a ferroelectric layer has been recently considered. In this method, a lower electrode is patterned and a capacitor dielectric layer is stacked thereon. Then, without patterning the dielectric layer, an upper electrode layer is stacked and patterned to form an upper electrode.

In another method of preventing degradation of a ferroelectric layer, a curing thermal process can be performed on a ferroelectric layer that is damaged by the patterning process. Specifically, at a suitable temperature, which is lower than a temperature for forming the perovskite structure of a ferroelectric layer, a thermal process is performed in an oxygen ambient to cure the damage resulting from patterning the ferroelectric layer. FIG. 1 illustrates a graph indicating ferroelectric recovery according to a thermal process temperature and applied voltage in a thermal process performed after patterning a ferroelectric layer. As shown in FIG. 1, when the temperature of the thermal process is the same, if an applied voltage is high, the polarization region is high. And, when the applied voltage is the same, if a temperature of the thermal process is high, the polarization region is much higher. That is, according to this graph, as the applied voltage increases, and as the temperature of the thermal process increases, an average value of the polarization increases.

However, although the ferroelectric layer is not etched and patterned, the ferroelectric structure can be damaged during a subsequent patterning process for forming an upper electrode. Additionally, the curing thermal process can degrade conductivity between a capacitor electrode and a contact. That is, since the curing thermal process is performed in an oxygen ambient of high temperature, a conductive material is oxidized at an electrode or a contact interface related to a storage node capacitor, thereby creating an insulation material and increasing resistance. This prevents normal operation.

FIG. 2 illustrates a partial cross-sectional view showing a structure of a cell capacitor of a FRAM device to explain an example of the above-described problem. Referring to FIG. 2, a conductive plug 20 is formed through an interlayer dielectric layer 10 formed on a semiconductor substrate (not shown), and a capacitor is formed on and covering the conductive plug 20. The capacitor is composed of an adhesive assistant pattern 30 formed of a thin titanium layer covering the conductive plug 20 and the interlayer dielectric layer 10 peripheral to the conductive plug 20, a lower electrode 40, a ferroelectric pattern 50, and an upper electrode 60. The lower and upper electrodes 40 and 60 are formed of a single layer or a multiple layer including at least one of the noble metals, which are difficult to oxidize, or metal oxides with conductivity. Thus, each of the electrode layers is not seriously influenced by the curing thermal process, which is performed in the oxygen ambient of high temperature. However, the titanium layer of the adhesive assistant pattern 30 is exposed to the oxygen ambient of high temperature during the curing thermal process, and is changed into an insulation oxide layer. This prevents normal operation of a memory device.

SUMMARY OF THE INVENTION

In the ferroelectric memory device according to the present invention, an oxygen barrier layer is formed over cell capacitor patterns, and patterned to at least cover sidewalls of an adhesive assistant pattern in the cell capacitor patterns. The patterning of the oxide barrier layer is such that the resulting oxide barrier pattern does expose sidewalls of a ferroelectric pattern of the cell capacitor patterns. When a subsequent thermal curing operation is conducted to cure the damaged portions of the ferroelectric pattern, the oxygen barrier pattern prevents the adhesive assistant pattern from oxidizing. As a result, the contact interface resistance at the adhesive assistant pattern does not degrade, and operation error is prevented.

DESCRIPTION OF THE PREFERRED EMBODIMENT

The present invention will now be described more fully hereinafter with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art.

First, a front-end process of a conventional ferroelectric memory device, which is not illustrated, will be schematically explained. A cell transistor is formed at an isolated active region. A bit line is formed over the cell transistor to be electrically connected to a drain region of the cell transistor. An interlayer dielectric layer is formed over the bit line, and a storage node contact plug is formed through the interlayer dielectric layer for electrical connection to a source region of the cell transistor.

Figure 1:
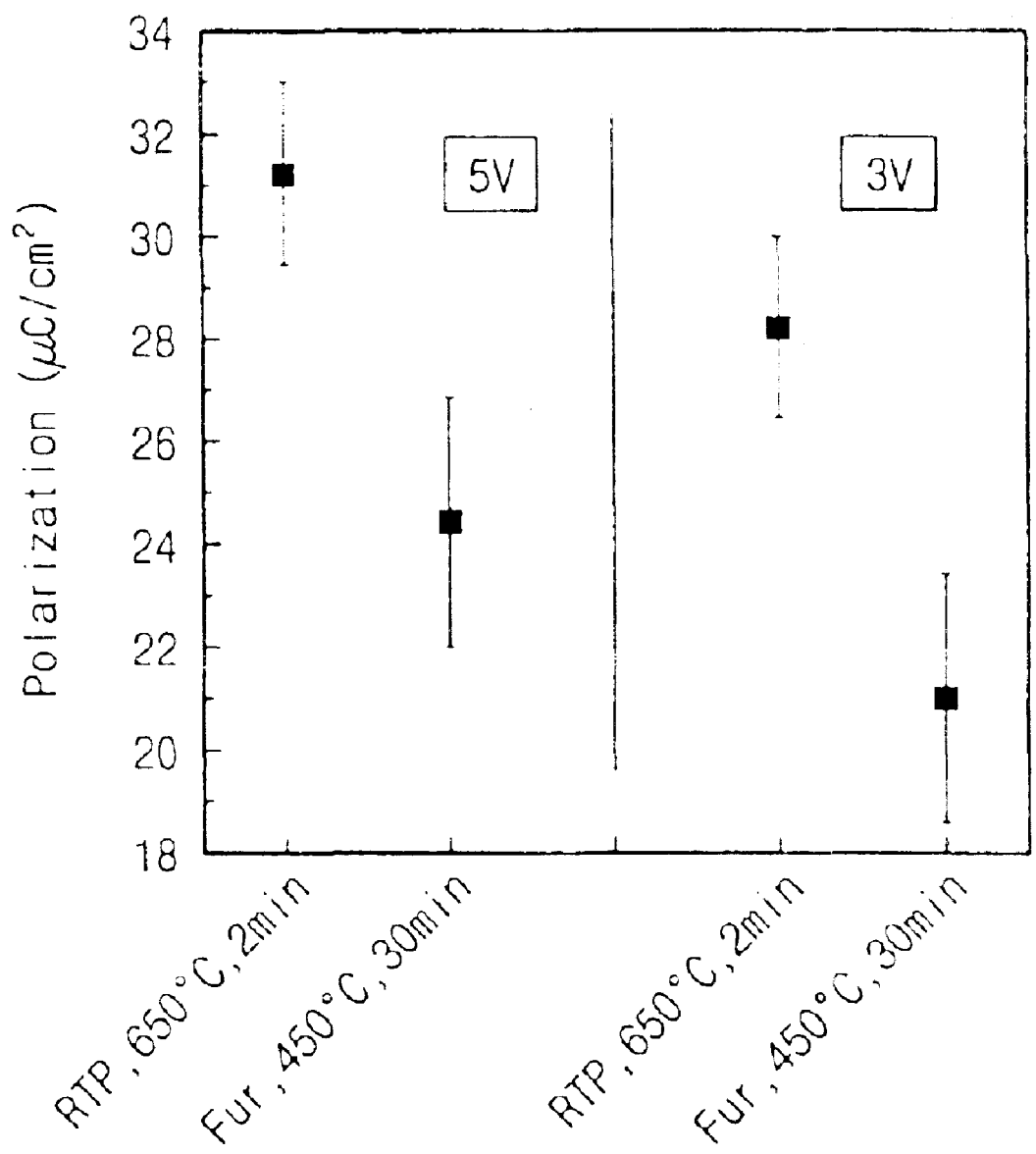
FIG. 1 illustrates a graph indicating a ferroelectric recovery according to thermal process temperature and applied voltage in a thermal process performed after patterning a ferroelectric layer.
Figure 2:
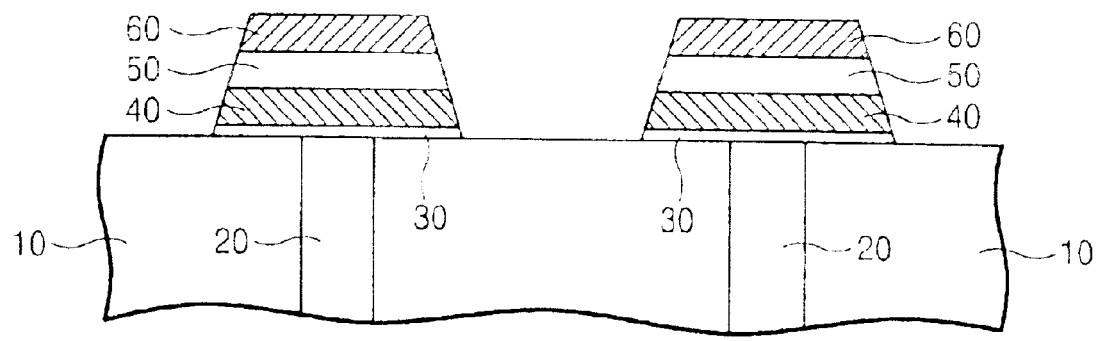
FIG. 2 illustrates a partial cross-sectional view of a conventional cell capacitor of a FRAM device.
Figure 3:
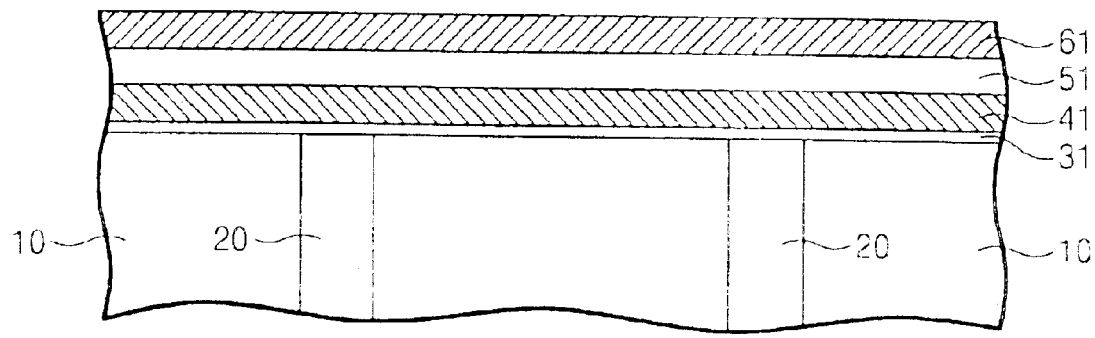
FIGS. 3 through 7 illustrate cross-sectional views of a process for forming cell capacitors of a FRAM device.

Referring to FIG. 3, a titanium layer is formed by a sputtering technique as an adhesive assistant layer 31, with a thickness of 100 Å, on an interlayer dielectric layer 10 and a contact plug 20 formed in the interlayer dielectric layer 10. Then, a platinum layer, an oxide iridium layer, and an iridium layer having thicknesses of 500 Å, 300 Å, and 500 Å, respectively, are sequentially formed over the adhesive assistant layer 31 to form a lower electrode layer 41. A PZT solution is coated and dried by using a sol-gel transfer technique to form a ferroelectric layer 51 of 1,000 Å. The resulting structure is thermally treated in an oxygen ambient of 700° C. to make a PZT layer having a perovskite structure of ferroelectricity. An iridium oxide layer and an iridium layer are formed with thicknesses of 1,000 Å and 200 Å, respectively, over the PZT layer 51 to form an upper electrode layer 61.

The adhesive assistant layer 31 alleviates stress between the lower electrode layer 41 and the interlayer dielectric layer 10 according to a thermal process and increases an adhesive force therebetween. The adhesive assistant layer 31 can be formed of one selected from a group of titanium, titanium nitride, titanium silicide, titanium aluminum nitride (TiAlN), and titanium silonitride (TiSiN). Also, the adhesive assistant layer 31 can be formed of a metal with a high melting point, such as tantalum, iridium, ruthenium, and tungsten, or silicide or nitride thereof, such as tantalum silonitride (TaSiN) and tantalum aluminum nitride (TaAlN), by using a sputtering technique, a CVD technique, and a sol-gel transfer technique.

The ferroelectric layer 51 can be formed of a ferroelectric material such as PZT[Pb(Zr,Ti)O$_3$], SrTiO$_3$, BaTiO$_3$, BST [(Ba,Sr)TiO$_3$], SBT(SrBi$_2$Ta$_2$O$_9$), (Pb,La)(Zr,Ti)O$_3$, and Bi$_4$Ti$_3$O$_{12}$, by using a CVD, an atomic layer deposition (ALD), a sputtering or a sol-gel transfer technique.

Each of the electrode layers including the lower electrode layer 41 and the upper electrode layer 61 can be formed of a single layer or multiple layers including at least one metal selected from a group of platinum, ruthenium, iridium, rhodium, osmium, and palladium, or a conductive oxide of the metal.

Figure 4:
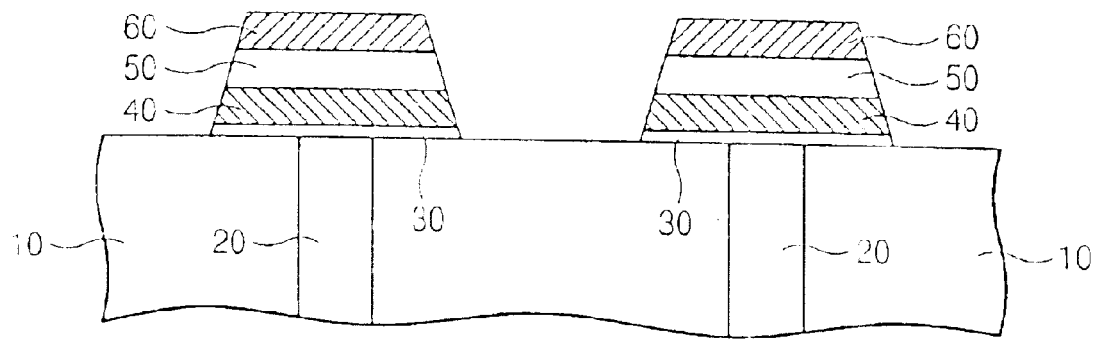

Referring to FIG. 4, a photoresist pattern (not shown) is formed on the upper electrode layer 61 and used as an etch mask to etch the upper electrode layer 61, the ferroelectric layer 51, the lower electrode layer 41 and the titanium adhesive assistant layer 31. The etching forms capacitor patterns of an upper electrode 60, a ferroelectric pattern 50, a lower electrode 40, and an adhesive assistant pattern 30. Each of the capacitor patterns covers each of the contact plugs 20 of a cell region. Sidewalls of the capacitor patterns are sloped because of the polymer formed during the etching process. A remnant photoresist pattern is then removed through an ashing process.

During the patterning process, the perovskite structure of a peripheral part of the ferroelectric pattern 50 is damaged by the etching process. Thus, the polarization characteristic and ferroelectricity of the ferroelectric layer are degraded.

Figure 5:
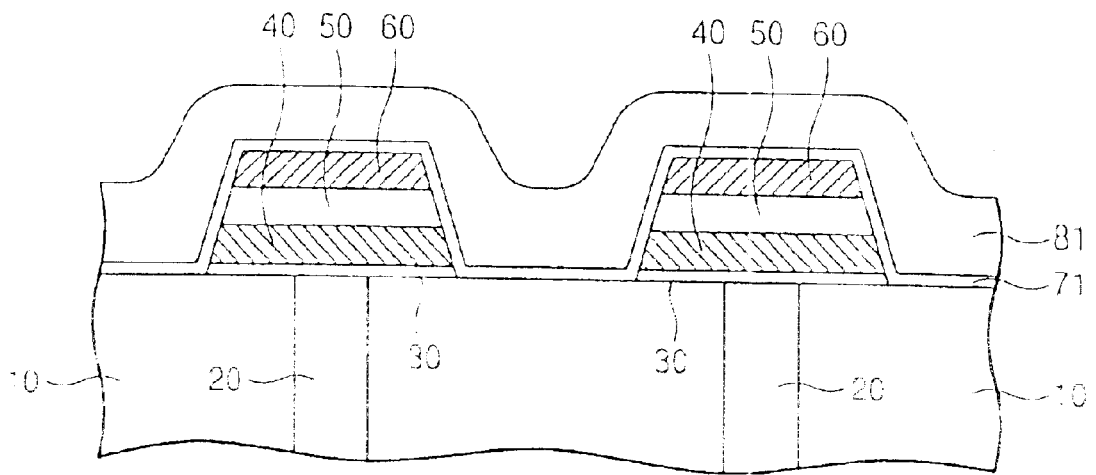

Referring to FIG. 5, an aluminum oxide layer (Al$_2$O$_3$) is formed with a substantially uniform thickness of 100 Å as an oxygen barrier layer 71 over the semiconductor substrate. The aluminum oxide layer can be formed by using a sputtering, a CVD or an atomic layer deposition (ALD) technique, and if the thickness thereof is thicker than 100 Å, this is enough to provide an oxygen barrier. The oxygen barrier layer 71 also can be formed of titanium dioxide, zirconium dioxide, or cesium dioxide as well as aluminum oxide. An undoped silicate glass (USG) layer is thickly formed as a material layer 81 by a high density plasma (HDP) CVD technique on the oxygen barrier layer 71. By making the thickness of the material layer 81 sufficiently larger than half the distance between adjacent capacitor patterns, the material layer 81 formed between the capacitor patterns is thicker than that on the capacitor patterns. In order to create the difference in thickness, the material layer 81 is stacked and reflowed on the oxygen barrier layer 71, and a planarization-etching process is additionally performed.

Figure 6:
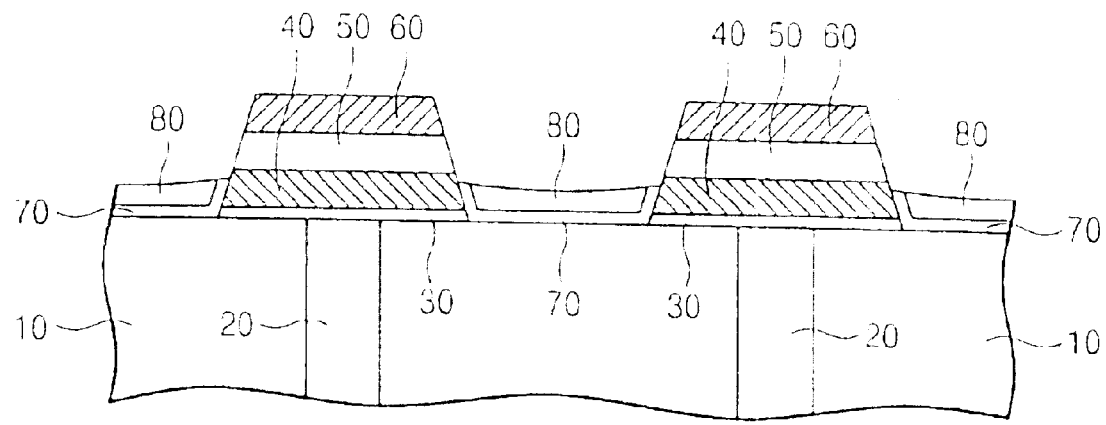

Referring to FIG. 6, using an anisotropical etching process, i.e., through an etch-back process, the oxygen barrier layer 71 of, for example, aluminum oxide and the material layer 81 of, for example, USG are etched and recessed to expose sidewalls of the upper electrode 60 and the ferroelectric pattern 50 in the capacitor patterns. The oxygen barrier layer is left as an oxygen barrier pattern 70 to cover a lower or entire sidewall of the lower electrode pattern 40, and thus the entire sidewall of the adhesive assistant pattern 30. The etching is performed so that the oxygen barrier pattern 70 covers the sidewall of the assistant adhesive pattern 30, and, preferably, at least a portion of the sidewall of the lower electrode 40. The oxygen barrier pattern 70 can cover the sidewall of the lower electrode 40 ranging anywhere from the bottom to the top of the lower electrode 40.

If the space between the capacitor patterns is viewed as a trench, the trench has the sidewalls of the capacitor patterns as sidewalls and has the interlayer dielectric layer 10 between the capacitor patterns as a bottom surface. Accordingly, a lower space of the trench is filled by the oxygen barrier pattern 70 and a material pattern 80.

Next, a curing thermal process is performed in an oxidation ambient of high temperature in order to recover a polarization characteristic of the degraded ferroelectric layer 50. The curing thermal process is conventionally performed at a temperature that is lower than 700° C. for the thermal process of forming the ferroelectric pattern 50 but higher than 450° C., and is performed within 30 minutes. However, because of the oxygen barrier pattern 70 of, for example, aluminum oxide, the adhesive assistant pattern 30 of titanium is not oxidized even if the thermal process is conducted at 800° C. for 30 minutes. As a result, the contact resistance hardly increases as a result of the curing thermal process. The curing thermal process can be performed in a furnace or by rapid thermal processing (RTP).

Figure 7:
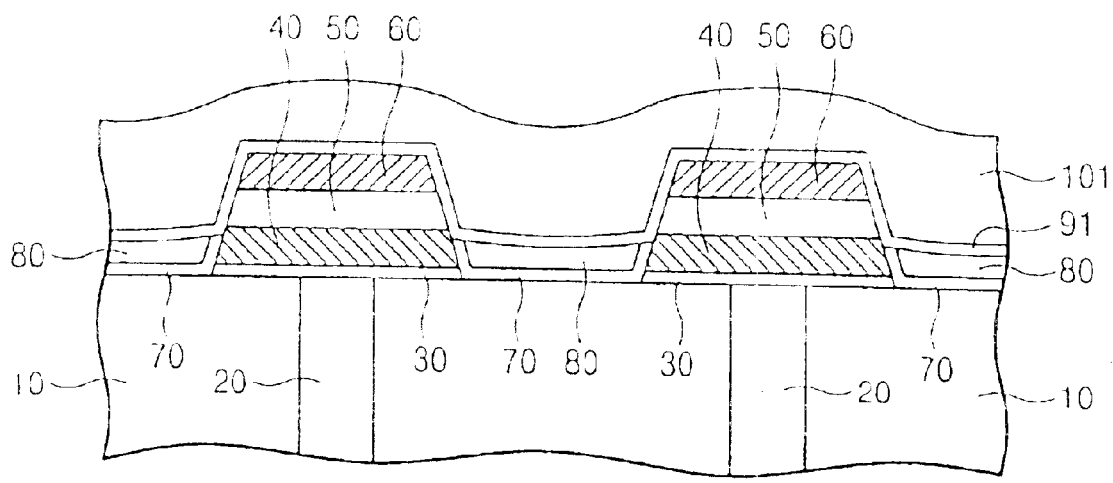

Referring to FIG. 7, a hydrogen barrier layer 91 is thinly formed over the semiconductor substrate to a thickness of 100 Å to protect the ferroelectric pattern 50 from hydrogen diffusion. A metal oxide is usually used for the hydrogen barrier layer 91. An aluminum oxide layer can be used as not only an oxygen barrier layer 71 but also as a good hydrogen barrier layer 91. An interlayer dielectric layer 101 is thickly formed on the hydrogen barrier layer 91 to fill an upper space between the capacitor patterns, and subsequent upper interconnections can then be formed using conventional techniques.

According to the present invention, ferroelectric degradation of a capacitor ferroelectric layer resulting from a patterning process can be cured through a thermal process, while, simultaneously, oxidation of an adhesive assistant pattern between a lower electrode and a contact plug is prevented; thereby preventing an operation error resulting from an increase in a contact interface resistance of a ferroelectric memory device.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming a ferroelectric memory device, comprising:

forming at least one capacitor pattern over a substrate, each capacitor pattern having an adhesive assistant pattern, a lower electrode, a ferroelectric pattern, and an upper electrode;

forming an oxygen barrier layer over the substrate;

etching the oxygen barrier layer to expose a sidewall of the ferroelectric pattern but not a sidewall of the adhesive assistant pattern; and performing a thermal process for curing ferroelectricity.

2. The method as claimed in claim 1, wherein the forming at least one capacitor pattern step comprises:

sequentially forming an adhesive assistant layer, a lower electrode layer, a ferroelectric layer, and an upper electrode layer over a substrate; and patterning the sequentially formed layers to create each capacitor pattern.

3. The method as claimed in claim 1, wherein the oxygen barrier layer is formed to have a substantially uniform thickness over the substrate.

4. The method as claimed in claim 1, wherein the etching step is performed by anisotropically etching.

5. The method as claimed in claim 1, wherein the thermal process for curing ferroelectricity is performed in an oxygen ambient at a temperature of 450~800° C. for 30 minutes or less.

6. The method as claimed in claim 1, after performing the thermal process for curing the ferroelectricity, further comprising:

forming a hydrogen barrier layer over the substrate to cover each capacitor pattern; and forming an interlayer dielectric layer over the hydrogen barrier layer to fill up a space between the capacitor patterns.

7. The method as claimed in claim 6, wherein the hydrogen barrier layer is formed of aluminum oxide.

8. The method as claimed in claim 1, after the forming an oxygen barrier layer step, further comprising:

forming a material layer over the oxygen barrier layer such that portions of the material layer between the capacitor patterns is thicker than portions of the material layer over a top of the capacitor patterns.

9. The method as claimed in claim 8, wherein the forming the material layer step is performed by at least one of:

stacking and reflowing the material layer, stacking the material layer and performing a planarization-etching process, and performing a blanket CVD process.

10. The method as claimed in claim 1, wherein the forming the oxygen barrier layer step is performed by one of a chemical vapor deposition (CVD), an atomic layer deposition (ALD), and a sputtering technique.

11. The method as claimed in claim 2, wherein the ferroelectric layer is formed through a crystallization process in an oxygen ambient at a temperature above 700° C. by using one of a sol-gel transfer, a sputtering, and a CVD technique.

* * * * *